United States Patent
Cabral, Jr. et al.

(10) Patent No.: US 10,290,594 B2
(45) Date of Patent: May 14, 2019

(54) FRAGMENTING COMPUTER CHIPS

(71) Applicant: International Business Machines Corporation, Armonk, NY (US)

(72) Inventors: Cyril Cabral, Jr., Yorktown Heights, NY (US); Kenneth P. Rodbell, Sandy Hook, CT (US)

(73) Assignee: International Business Machines Corporation, Armonk, NY (US)

( * ) Notice: Subject to any disclaimer, the term of this patent is extended or adjusted under 35 U.S.C. 154(b) by 181 days.

(21) Appl. No.: 15/222,056

(22) Filed: Jul. 28, 2016

(65) Prior Publication Data

US 2018/0096954 A1    Apr. 5, 2018

(51) Int. Cl.
| | |
|---|---|
| *H05K 1/18* | (2006.01) |
| *C06B 43/00* | (2006.01) |
| *C06B 45/10* | (2006.01) |
| *C06B 45/14* | (2006.01) |
| *H01L 23/00* | (2006.01) |
| *H01L 23/58* | (2006.01) |
| *H01L 27/24* | (2006.01) |

(52) U.S. Cl.
CPC ............ *H01L 23/576* (2013.01); *C06B 43/00* (2013.01); *C06B 45/10* (2013.01); *C06B 45/14* (2013.01); *H01L 23/573* (2013.01); *H01L 23/585* (2013.01); *H05K 1/185* (2013.01); *H01L 27/2472* (2013.01); *H01L 2924/0002* (2013.01)

(58) Field of Classification Search
CPC ... H01L 51/56; H01L 27/14627; H04N 5/378; H05K 1/115; H05K 3/4644
USPC ........................................................ 257/419
See application file for complete search history.

(56) References Cited

U.S. PATENT DOCUMENTS

| | | | |
|---|---|---|---|
| 5,042,386 A | 8/1991 | Kruse et al. | |
| 6,209,457 B1 | 4/2001 | Kenworthy et al. | |
| 7,880,248 B1 | 2/2011 | Pham et al. | |
| 7,896,988 B2 | 3/2011 | Mohler | |
| 8,816,717 B2 | 8/2014 | Fritz et al. | |
| 2013/0029438 A1* | 1/2013 | Takai | H01L 21/50 438/27 |
| 2014/0103957 A1 | 4/2014 | Fritz et al. | |
| 2016/0137548 A1* | 5/2016 | Cabral, Jr. | C03C 15/00 430/325 |

FOREIGN PATENT DOCUMENTS

| | | |
|---|---|---|
| CN | 103868417 A | 6/2014 |
| CN | 104867885 A | 8/2015 |
| RU | 2455728 C1 | 7/2012 |
| RU | 2455729 C1 | 7/2012 |
| RU | 2527241 C1 | 8/2014 |
| WO | 2016033123 A1 | 3/2016 |

OTHER PUBLICATIONS

Fischer et al., A Survey of Combustible Metals, Thermites, and Intermetallics for Pyrotechnic Applications, SAND95-2448C, 32nd AIAA/ASME/SAE/ASEE Joint Propulsion Conference, Lake Buena Vista, FL, Jul. 1-3, 1996, pp. 1-13.

* cited by examiner

*Primary Examiner* — Andy Huynh
(74) *Attorney, Agent, or Firm* — Alexander G. Jochym

(57) ABSTRACT

A method comprising bonding a first substrate to a second substrate. The first substrate includes a layer of one or more pairs of reactive material. The method comprising triggering a reaction between the one or more pairs of reactive material and fragmenting the second substrate.

17 Claims, 14 Drawing Sheets

FRAGMENTING COMPUTER CHIPS

STATEMENT REGARDING FEDERALLY SPONSORED WORK

This invention was made with United States Government support under contract number N00014-12-C-0472 entered with the following United States Governmental Agency: Department of Defense. The United States government has certain rights to this invention.

BACKGROUND OF THE INVENTION

The present invention relates generally to the field of material science, and more particularly to triggering the fragmentation of integrated chips using intermetallic reactions.

The fragmentation of many brittle materials can be controlled by introducing inhomogeneous stress fields within the materials. For example, highly stressed glass has been known to fragment into small pieces since the discovery in the $17^{th}$ and $18^{th}$ centuries of the phenomenon known as Prince Rupert's drops. The basic mechanism by which fragmentation occurs, however, has only recently been understood using the framework of fracture mechanics. The phenomenon relies on setting up glass in a highly tensile stressed state by containing it in a thick, compressively stressed outer layer. In Prince Rupert's drops this is accomplished by quenching molten glass in water to form glass boules. More recently, it has been shown that ion exchange processing of soda lime glass is another effective way of generating a compressively stressed surface layer.

Intermetallic reactions are exothermic reactions that involve numerous elements such as aluminum (Al), antimony (Sb), barium (Ba), beryllium (Be), bismuth (Bi), boron (B), cadmium (Cd), calcium (Ca), carbon (C), cerium (Ce), cobalt (Co), chromium (Cr), copper (Cu), germanium (Ge), hafnium (Hf), iron (Fe), lanthanum (La), lead (Pb), lithium (Li), magnesium (Mg), manganese (Mn), molybdenum (Mo), niobium (Nb), nickel (Ni), palladium (Pd), potassium (K), praseodymium (Pr), platinum (Pt), plutonium (Pu), samarium (Sm), selenium (Se), silicon (Si), sodium (Na), strontium (Sr), sulfur (S), tantalum (Ta), tellurium (Te), thorium (Th), tin (Sn), titanium (Ti), tungsten (W), uranium (U), vanadium (V), Yttrium (Y), zinc (Zn), and zirconium (Zr). The term "intermetallic reactions," which was introduced in the 1950s, has become somewhat of a misnomer since elements from virtually every periodic group except the halogens and noble gases participate in these reactions.

The individual elements used in intermetallic reactions tend to be relatively unreactive. However, strongly exothermic reactions take place when certain pairs of the elements are combined and ignited. Sources of ignition include electrical discharge, flame, mechanical friction, impact, etc. In many intermetallic reactions, oxygen is not required and no gases are produced. The products of many of these reactions are solid-state compounds exhibiting metallic bonding, defined stoichiometry, and an ordered crystal structure. Because of the intense heat generated, intermetallic reactions have found many uses in applications such as welding, bonding, melting, and microelectronics.

SUMMARY

According to one embodiment of the present disclosure, a method comprising bonding a first substrate to a second substrate. The first substrate includes a layer of one or more pairs of reactive material. The method comprising triggering a reaction between the one or more pairs of reactive material and fragmenting the second substrate.

According to one embodiment of the present disclosure, a structure comprising an integrated circuit (IC) assembly. The IC assembly includes a first substrate and a second substrate. The second substrate is bonded to the first substrate. The IC assembly further includes one or more IC components. The one or more IC components are formed on the second substrate on a side opposite to a bond between the first substrate and the second substrate. The IC assembly further includes a layer of one or more pairs of reactive materials. The layer of one or more pairs of reactive materials are formed on the first substrate on a side opposite to the bond between the first substrate and the second substrate.

According to one embodiment of the present disclosure, a structure comprising a handler substrate. The handler substrate includes a stressed brittle material and one or more layers of one or more pairs of reactive material. The one or more layers of one or more pairs of reactive material is one or more of: i) in direct contact with the stressed brittle material; ii) separated from the stressed brittle material by a material that has a different thermal expansion coefficient than the stressed brittle material; iii) separated from the stressed brittle material by an insulating layer; and iv) separated from the stressed brittle material by a material that has a different acoustic impedance than the stressed brittle material.

BRIEF DESCRIPTION OF THE SEVERAL VIEWS OF THE DRAWINGS

The following detailed description, given by way of example and not intended to limit the disclosure solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
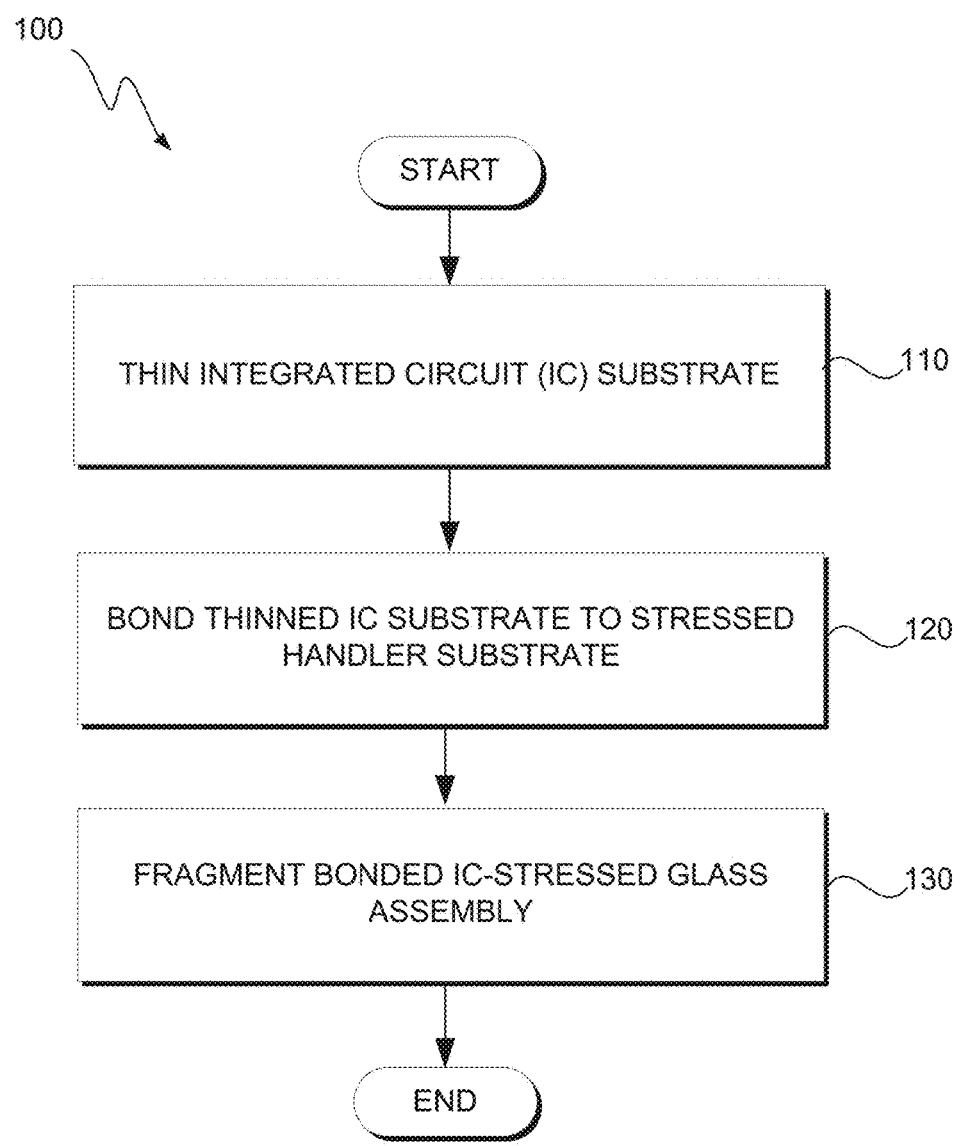
FIG. 1 illustrates processes utilized to bond and fragment an integrated circuit (IC) using stressed glass as a handler substrate.

Intermetallic reactions have been used in stacks of thin films in order to non-destructively erase the contents of non-volatile memory. The stacks of thin films (often referred hereafter as reactive material (RM) stacks) include layers of intermetallic reactants separated by barriers. The barriers serve to prevent reaction of the intermetallic reactants until an ignition event. Upon ignition, enough energy is released from the RM stacks to cause the phase change material (e.g., $Ge_2Sb_1Te_5$) within a plurality of phase change memory (PCM) cells to transition from an amorphous state to a poly-crystalline state thereby erasing the PCM non-destructively (i.e., the PCM is still operable).

The erasure of PCM serves to prevent the discovery of sensitive data through tampering. However, in some cases it is preferable to actually destroy part or all of a computer chip itself such that a computing device containing the chip cannot be used again. For example, the loss of a computing device (e.g., cellphone, laptop, smartwatch) of a first user is, in some scenarios, less problematic if the device is rendered useless by irreversible fragmentation of the device's integrated chip before, upon, or subsequent to the device coming into the possession of another user. In some cases, the irreversible fragmentation of an integrated chip is even more desirable when it has a known resale value or is otherwise determined to be desirable for possession by that other user.

Embodiments of the present invention recognize that destructively fragmenting an integrated chip on a computing device is often desirable when the computing device has been lost or stolen. Embodiments of the present invention provide one or more processes and structures for formation of a handler substrate, wherein the handler substrate includes inhomogeneous stress fields that trigger fragmentation of the handler substrate when force is applied. Embodiments of the present invention provide one or more processes and structures for integrating reactive material (RM) into the handler substrate as a trigger for fragmentation. Embodiments of the present invention provide one or more processes and structures for bonding the handler substrate to the substrate of an integrated chip. Embodiments of the present invention provide one or more processes and structures for destructive fragmentation of the handler substrate-bonded integrated chip.

Exemplary embodiments now will be described more fully herein with reference to the accompanying drawings, in which exemplary embodiments are shown. In the following detailed description, numerous specific details are set forth in order to provide a thorough understanding of various embodiments of the invention. However, it is to be understood that embodiments of the invention may be practiced without these specific details. As such, this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments.

As described below in conjunction with FIGS. 1-13, embodiments include methods and structures for forming a handler substrate that includes the formation of one or more layers of RM. As used herein, the term "handler substrate" includes a stressed brittle material such as stressed glass. As used herein, "stressed glass" includes glass that has tensile-stressed interior surrounded by a compressive-stressed surface. The methods described below in conjunction with FIGS. 1-13 may be incorporated into typical semiconductor fabrication processes.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

As used herein, the term "and/or" is inclusive. For example, A, B, and/or C means that at least one of A or B or C is true and applicable.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

As used herein, terms such as "depositing", "forming", and the like refer to the disposition of layers or portions of materials in the present embodiments. Such processes may not be different than in the standard practice of the art of IC fabrication. Such practice includes but is not limited to, metalorganic chemical vapor deposition (MOCVD), atomic layer deposition (ALD), chemical vapor deposition (CVD), low-pressure chemical vapor deposition (LPCVD), plasma enhanced chemical vapor deposition (PECVD), ultrahigh vacuum chemical vapor deposition (UHVCVD), physical vapor deposition, sputtering, plating, evaporation, ion beam deposition, electron beam deposition, laser assisted deposition, chemical solution deposition, or any combination of those methods.

As used herein, semiconductor structures refer to one or more physical structures that comprise semiconductor devices.

In order to ensure that a lost or stolen integrated chip cannot be used or reverse engineered, destructive fragmentation of the chip should produce the smallest fragments possible. In various embodiments of the present invention, destructive fragmentation of integrated chips is accomplished by bonding the chips to a handler substrate such as stressed glass. After bonding the integrated chip to the handler substrate, fragmentation of the handler substrate provides fragmentation of the bonded chip. In general, the higher the internal tensile stress within stressed glass the smaller the glass fragments will be and, thus, the smaller the bonded integrated chip fragments will be.

In various embodiments, stressed glass used as handler substrate is made by an ion exchange process. Glass such as sodium aluminosilicate glass contains sodium ions ($Na^+$). The sodium ions are exchanged with potassium ions ($K^+$) by subjecting the glass to a salt melt composed of potassium nitrate ($KNO_3$) at a temperature range between approximately 400° C. and approximately 450° C. The larger potassium ions displace the smaller sodium ions at the surface of the glass thereby creating residual compressive stress at the glass surface. The residual compressive stress is counterbalanced by residual internal tensile stress. Compressive and tensile stress in the glass is increased the longer the ion exchange process is carried out.

Fragmentation of an integrated chip bonded to a handler substrate such as stressed glass requires that the potential energy released during fragmentation of the stressed handler substrate (i.e., elastic energy) be greater or equal to the kinetic energy required to break the bonds holding both the handler substrate and the bonded integrated chip together (i.e., surface energy). Thus, the thinner the stressed glass handler substrate is, the thinner the integrated chip needs to be. In addition, a high adhesion energy between the handler substrate and integrated chip must be established or else the chip will delaminate at various points of contact with the handler substrate. A poor adhesion energy results in chip fragmentation characteristics that do not match handler substrate fragmentation characteristics observed absent the bonded chip. In other words, elastic energy released during handler substrate fragmentation is wasted pulling apart the bonds between the handler substrate and the integrated chip instead of being used to fragment the chip.

FIG. 1 illustrates processes (designated 100) utilized to bond and fragment an integrated chip using stressed glass as a handler substrate.

In step 110, an integrated circuit substrate (IC substrate) is thinned. In various embodiments, the IC substrate is thinned by the sequence: i) coarse grinding (~5 μm/s), ii) fine grinding (<1 μm/s), and iii) chemical mechanical polishing (CMP), atmospheric downstream plasma dry chemical etching (ADP DCE) and/or wet etching ($HF:HNO_3$). Step iii removes the damage done by the previous, higher rate removal steps in order to get down to the desired thickness leaving minimal defects. Using this process or similar processes, silicon complementary metal-oxide-semiconductor (CMOS) device chips still function after the IC substrate is thinned to thicknesses less than 100 μm and even when thinned to the silicon-on-oxide buried oxide (SOI BOX) level (<<5 μm).

In step 120, the thinned IC is bonded to a stressed glass handler substrate. In an example involving silicon, stressed glass (550 μm to 700 μm thick) is cleaned by sonication in acetone followed by an isopropanol rinse and an oxygen ash using a power of 150 W for 5 min. A 2% sodium silicate solution is spun onto silicon (the silicon being 50 μm to 720 μm thick) at 1500 rpm for 20 seconds to achieve an ultrathin, uniform layer. The glass and silicon are brought into contact with each other and manually tacked together using a hard rod. Once the initial bond is visible through the glass, the assembly is transferred to a press at 2000 to 2500 psi. Finally, the pressed assembly is annealed on a hotplate between approximately 70° C. and approximately 90° C. In another example involving silicon, anodic bonding is utilized where pressure, temperature, and high voltage are used to form bonds at the interface between the stressed glass and silicon. The glass is cleaned with acetone and the silicon is cleaned with both acetone and HF. The glass and silicon are inserted between two electrodes held at >100 V for the duration of the bond. A pressure between approximately 40 psi and approximately 50 psi is held at a temperature of approximately 200° C. during the bonding process. Both p-type and n-type silicon wafers are amenable to this process. However, n-type silicon wafers require more time to achieve the same degree of bonding as p-type wafers. The bonding process is continued until <1 uA of current is flowing through the two electrodes.

In step 130, the bonded IC-stressed glass assembly is fragmented. Fragmentation is caused by an impact force that penetrates the compressive shell of the stressed glass thereby releasing the internal tensile stress. The force necessary to trigger fragmentation (i.e., penetrate the compressive external layer of the stressed glass) is minimized by thinning the compressive layer. In various embodiments, thinning the compressive layer is done universally across one or both sides of the stressed glass via both dry and wet processing and/or locally on one or both sides of the stressed glass by etching away a portion of the compressive layer. In general, up to 80% of the compressive layer thickness can be removed. Fragmentation of a stressed glass handler substrate with an integrated chip bonded to it causes the bonded integrated chip to undergo fragmentation.

In various embodiments of the present invention, reactive material (RM) stacks are utilized to trigger fragmentation of an integrated circuit bonded to a handler substrate.

Figure 2:
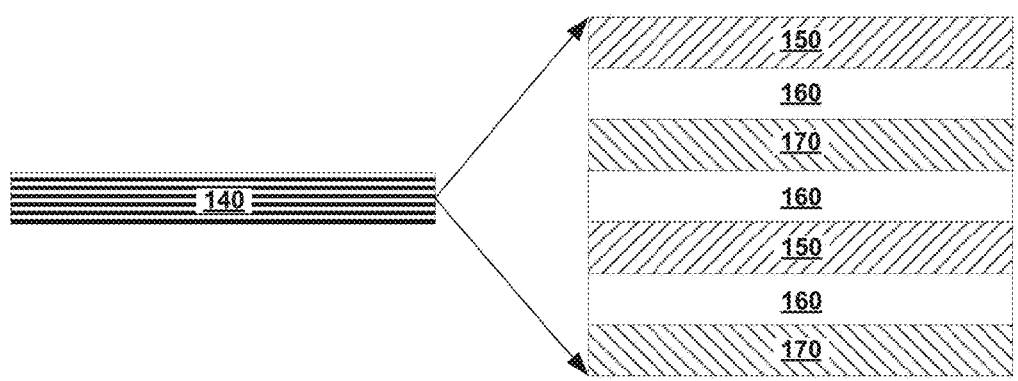
FIG. 2 illustrates a cross-sectional view of a reactive material (RM) stack in accordance with an exemplary embodiment of the present invention.

FIG. 2 illustrates a cross-sectional view of a reactive material (RM) stack 140 in accordance with an exemplary embodiment of the present invention.

RM stack 140 includes alternating layers of a first reactive material 150 (RM 150) and a second reactive material 170 (RM 170) with a barrier layer 160 sandwiched between each layer of the RM 150 and the RM 170. In various embodiments, RM stacks like RM stack 140 typically include up to one hundred of these layers and have a total thickness from approximately 0.5 μm to approximately 10 μm. However, embodiments of the present invention are not limited to the above description of potential RM stacks represented by RM stack 140. In various embodiments and scenarios, RM stacks represented by RM stack 140 include a number of layers of materials with respective compositions and thicknesses necessary to: i) readily initiate and propagate an exothermic chemical reaction when it is desired to do so, ii) after initiation of the exothermic chemical reaction, trigger the fragmentation of integrated chips, iii) self-propagate upon ignition so that an essentially complete reaction is obtained between RM 150 and RM 170, and/or iv) minimize damage, respectively, to persons and property that are in the presence of, i.e., within a threshold distance of, a computing device containing said RM stacks after ignition. In some embodiments, the fragmentation of the IC chips is such that the damage is not readily identifiable by an external examination of the computing device. For example, the damage is limited to a core processor of a smart phone and both the screen and casing of the smartphone are not physically damaged as is readily discernable by the human eye.

In various embodiments, RM 150 and RM 170 react with each other exothermically upon ignition. In various embodiments, the reaction of the first and second reactive materials is ignited by a constant current, resistive heating, mechanical stress, an electric spark, a laser pulse, and/or other similar energy ignition sources. In general, such initiation energy is great enough to initiate ignition of RM 150 and RM 170.

Exemplary sets of the RM 150 and RM 170 include, but are not limited to, Ni/Al, Al/Pd, Al/Pt, Cu/Pd, Nb/Si, and Ti/Al. Additional exemplary sets of RM 150 and RM 170 that are used in various embodiments of the present application are described in "A Survey of Combustible Metals, Thermites, and Intermetallics for Pyrotechnic Applications", by Fischer et al., 32nd AIAA/ASME/SAE/ASEE Joint Propulsion Conference, Lake Buena Vista, Fla., 1996, the disclosure of which is hereby incorporated by reference in its entirety.

Upon ignition, RM 150 and RM 170 intermix due to atomic diffusion to form an alloy, intermetallic and/or composite of RM 150 and the RM 170. The change in chemical bonding, caused by interdiffusion and compound formation, generates heat in an exothermic chemical reaction.

In various embodiments, the layers of RM 150 and RM 170 are provided using conventional film deposition techniques such as, for example, physical vapor deposition (PVD) or chemical vapor deposition (CVD), atomic layer deposition (ALD), electroplating and spin-on (sol-gel) processing. In one embodiment, the layers of RM 150 and RM 170 are deposited via evaporation at ambient temperature and the finished RM stack 140 is patterned by a lift-off process (resist dissolution in acetone to leave RM patterns in desired locations). In an exemplary embodiment, RM deposition is achieved via sputtering at temperatures as low as approximately 4° C.

In various embodiments, the thickness of RM 150 and RM 170 ranges from approximately 1 nm to approximately 200 nm. In other embodiments, lesser or greater thicknesses are utilized. In some embodiments, the thickness of the layers of RM 150 and RM 170 are substantially the same. In other embodiments, the layers of RM 150 and the layers of RM 170 are of a comparably different thickness. In various embodiments and scenarios, the thickness of RM 150 and RM 170 reflect the stoichiometry of the reaction between them. For example, if the desired intermetallic reaction is $Al_{(s)}+Pd_{(s)} \rightarrow AlPd_{(s)}$, then a layer of aluminum is deposited and a layer of palladium are deposited that are approximately equimolar to each other. However, if the desired intermetallic reaction is $Al_{(s)}+3Ni_{(s)} \rightarrow AlNi_{3(s)}$, then a layer of aluminum is deposited and a layer of nickel is deposited, wherein the molar amount of nickel in the layer of nickel is approximately three times the molar amount of aluminum in the aluminum layer.

Figure 3:
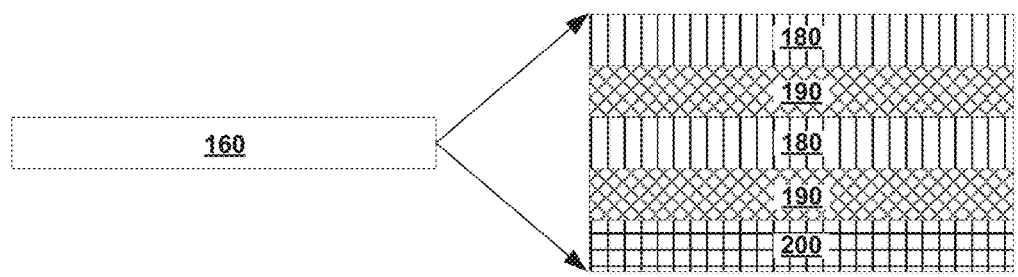
FIG. 3 illustrates a cross-sectional view of a barrier layer stack in accordance with an exemplary embodiment of the present invention.

FIG. 3 illustrates a cross-sectional view of barrier layer 160 in accordance with an exemplary embodiment of the present invention.

In various embodiments, barrier layer 160 acts as a diffusion barrier to reduce interdiffusion of RM 150 and RM 170 during deposition of RM 150 and RM 170 as well as during subsequent processes, thus preventing the reaction between RM 150 and RM 170 until ignition takes place. In some embodiments, barrier layer 160 includes transition metals, oxides of these transition metals, nitrides of these transition metals, aluminum oxide ($Al_xO_y$, with x from 1 to 2 and y from 1 to 3) or combinations thereof. Exemplary transition metals include, but are not limited to, Ti, Zr, Hf, V, Nb, Ta, the oxides of these exemplary transition metals, and the nitrides of these exemplary transition metals.

In some embodiments, barrier layer 160 is provided as a single layer structure. In other embodiments, barrier layer 160 is provided as a multiple layer stack (as depicted in FIG. 3). In some embodiments, barrier layer 160 is a single layer of a transition metal. In some embodiments where barrier layer 160 is a stack, barrier layer 160 includes a multiple layer stack selected from a group that includes $Ta/Ta_xO_y$, $Al_xO_y/Ta/Ta_xO_y$, or $Al_xO_y/Ta/Ta_xO_y/Ta/Ta_xO_y$. For example and as shown in FIG. 3, barrier layer 160 includes a five-layer stack of $Al_xO_y$ (labeled as 200 in the drawing) and alternating layers of Ta (labeled as 190 in the drawing) and $Ta_xO_y$ (labeled as 180 in the drawing) with x from 1 to 3 and y from 1 to 5. It should be noted that the number of alternating layers in a barrier layer stack is not limited to five layers as shown in FIG. 3. In various embodiments, other numbers of alternating layers can also be utilized in the barrier layer 160. In some embodiments and scenarios, the thickness of barrier layer 160 is between approximately 1 nm to approximately 20 nm. In other embodiments, lesser and greater thicknesses of barrier layer 160 are utilized. In exemplary embodiments, the thickness of barrier layer 160 is 3-5 nm.

In various embodiments, barrier layer 160 is provided, for example, by PVD, CVD, ALD, electroplating and/or spin-on (sol-gel) processing. In one embodiment, the one or more layers included in barrier layer 160 are deposited via evaporation at ambient temperature and the finished RM stack 140 is patterned by a lift-off process (resist dissolution in acetone to leave RM patterns in desired locations). In an exemplary embodiment, deposition of the one or more layers included in barrier layer 160 is achieved via sputtering at temperatures as low as approximately 4° C. In one embodiment and when transition metal oxides or metal nitrides are employed in barrier layer 160, the transition metal oxide layer or the transition metal nitride layer is provided by first forming a transition metal layer and converting a surface portion of the transition metal layer by thermal nitridation and/or thermal oxidation. In a second embodiment the transition metal oxide or nitride is formed in a reactive sputtering process, by depositing the metal in the presence of oxygen or nitrogen.

It should be understood that embodiments of the present invention are not limited to an RM stack such as RM stack 140 containing only one pair of alternating reactive materials (i.e., RM 150 and RM 170). In some embodiments, two or more reactive material pairs are employed to form an RM stack. Further, it should be understood that embodiments of the present invention are not limited to an RM stack containing only one barrier layer composition of matter or thickness. In some embodiments, barrier layers 160 have various different compositions of matter and thicknesses in a single RM stack. Additionally, in some embodiments and scenarios, barrier layers do not always separate reactive material pairs. Thus, when it is feasible to deposit a reactive material pair without a barrier layer between them, it is typically more cost-effective and time-effective to do so.

In various embodiments of the present invention, RM stacks such as RM stack 140 trigger fragmentation of an IC chip bonded to a handler substrate by transferring thermal energy directly to the handler substrate. In various embodiments, RM stacks such as RM stack 140 trigger fragmentation of an IC chip bonded to a handler substrate by transferring thermal energy to material embedded in the handler substrate. Embodiments of the present invention include one or more of the above embodiments for a single fragmentation of a given IC chip bonded to a given handler substrate.

In various embodiments, material embedded and/or layered on a handler substrate and/or a substrate layer of an IC substrate is a thermal expansion coefficient and/or acoustical impedance mismatch to the material(s) comprising the handler substrate and/or substrate layer of the IC (i.e., the embedded/layered material has a different thermal expansion coefficient and/or acoustical impedance than the material to which it is embedded/layered). In various embodiments, the embedded and/or layered material also influences the crack pattern of the handler substrate and/or substrate layer of the IC. In other words, a different crack pattern is observed absent the embedded/layered material and. a different crack pattern is observed when the material is layered vs. embedded.

FIGS. 4-7 depict illustrative embodiments of structures of handler substrates that include RM stack 140.

Figure 4:
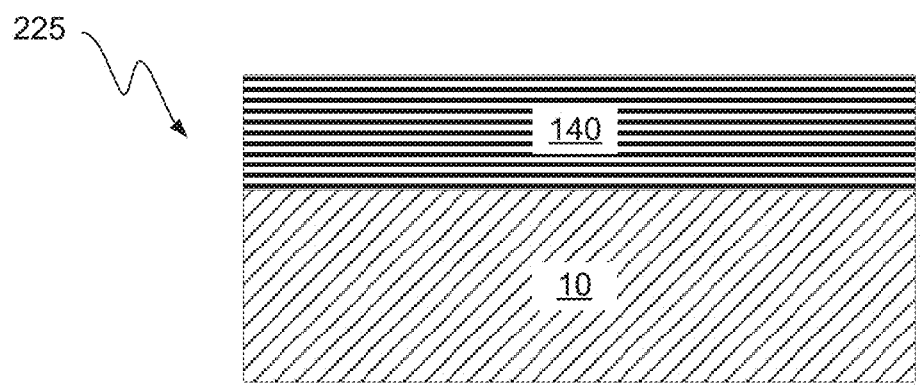
FIG. 4 depicts a first example of an RM/handler structure including a handler substrate and RM stack in accordance with an exemplary embodiment of the present invention.

FIG. 4 depicts structure 225, which includes handler substrate 10 and RM stack 140, in accordance with an exemplary embodiment of the present invention.

In various embodiments, handler substrate 10 is composed of a stressed brittle material such as stressed glass. In exemplary embodiments that include stressed glass, handler substrate 10 is the result of an ion exchange process on thin stressed glass (550 μm to 700 μm thick) and includes thin stressed glass that is further thinned to remove up to 80% of the compressive layer on at least one side of the glass in some exemplary embodiments.

In various embodiments when handler substrate 10 is an insulating layer such as stressed glass, RM stack 140 is deposited on top of handler substrate 10 using material and deposition processes described supra. In some embodiments, RM stack 140 is transferred from a thinned metallic tape or foil to a stressed glass handler substrate that serves as handler substrate 10.

Figure 5:
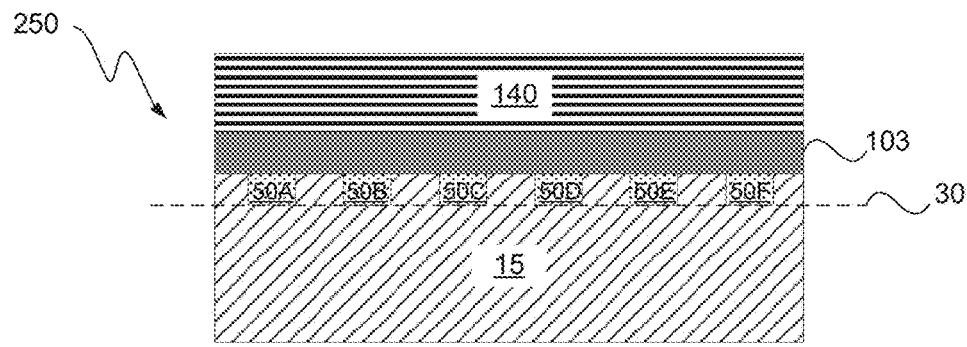
FIG. 5 depicts a second example of an RM/handler structure including an etched handler substrate, vias, insulating layer, and RM stack in accordance with an exemplary embodiment of the present invention.

FIG. 5 depicts structure 250, which includes etched handler substrate 15, vias 50A-50F, insulating layer 103, and RM stack 140, in accordance with an exemplary embodiment of the present invention. It should be understood that vias depicted herein (such as vias 50A-F) are illustrative and the number of vias depicted in any of the Figures may be more or less than the number seen in the Figures (i.e., in various embodiments there are fewer than six vias in a structure illustrated by structure 250 and in other embodiments there are more than six vias in a structure illustrated by structure 250).

In various embodiments, etched handler substrate 15 is formed from a stressed brittle material such as handler substrate 10, which is etched in the top compressive layer to level 30. Level 30 is above the tensile interior region of the stressed brittle material such that the material immediately below level 30 is still compressively stressed, however, the thickness of the compressive layer is diminished by as much as 80% at level 30 compared to the compressive layer thickness prior to etching etched handler substrate 15. In various embodiments, etched handler substrate 15 is etched via reactive ion etch (RIE) after lithographic patterning and/or wet etching.

In various embodiments, vias 50A-F are composed of any material that has a different thermal expansion coefficient and/or acoustic impedance than the material that composes etched handler substrate 15 (i.e., the material that vias 50A-F are composed of is a thermal expansion coefficient mismatch and/or acoustic impedance mismatch to the material that etched handler substrate 15 is composed of). In exemplary embodiments when etched handler substrate 15 is composed of stressed glass, vias 50A-F include one or more of the elements tungsten (W), molybdenum (Mo), tantalum (Ta), copper (Cu), nickel (Ni), cobalt (Co), and tin (Sn). In these embodiments, vias 50A-F are the result of material deposition onto etched handler substrate 15 utilizing physical vapor deposition, chemical vapor deposition or electroplating followed by CMP in order to planarize the deposited material.

In various embodiments, insulating layer 103 is deposited on top of vias 50A-F and the uppermost levels of etched handler substrate 15 via chemical vapor deposition (CVD). In various embodiments, insulating layer 103 is approximately 200 nm to approximately 1 μm thick. In other embodiments, insulating layer 103 is less than 200 nm or greater than 1 μm thick providing that it effectively serves the role of i) preventing premature termination of an exothermic reaction between reactive materials included in RM stack 140 layered above insulating layer 103 and ii) allows enough thermal energy to escape said reaction to trigger the fragmentation of a etched handler substrate 15. In various embodiments, insulating layer 103 is silicon dioxide ($SiO_2$), silicon nitride ($Si_3N_4$), a low-K dielectric material, and/or a poor thermal conducting polymer.

In some embodiments (not shown) when etched handler substrate 15 is stressed glass, insulating layer 103, as shown in structure 250, is not required. In these embodiments, vias 50A-F do not provide a sufficient heat sink to cause the premature termination of the exothermic reaction between reactive materials included in RM stack 140. Since stressed glass alone is a sufficient insulating material for preventing premature reaction termination of RM stack 140, the necessity of insulating layer 103 in structure 250 depends at least on: i) the composition of vias 50A-F (i.e., whether the thermal conductivity of the material that vias 50A-F are composed of is high enough so that insulating layer 103 is necessary for complete reaction of RM stack 140) and ii) the amount of surface area on RM stack 140 that vias 50A-F would be in contact with absent insulating layer 103.

In various embodiments, RM stack 140 is deposited on top of insulating layer 103 using material and deposition processes described supra.

Figure 6:
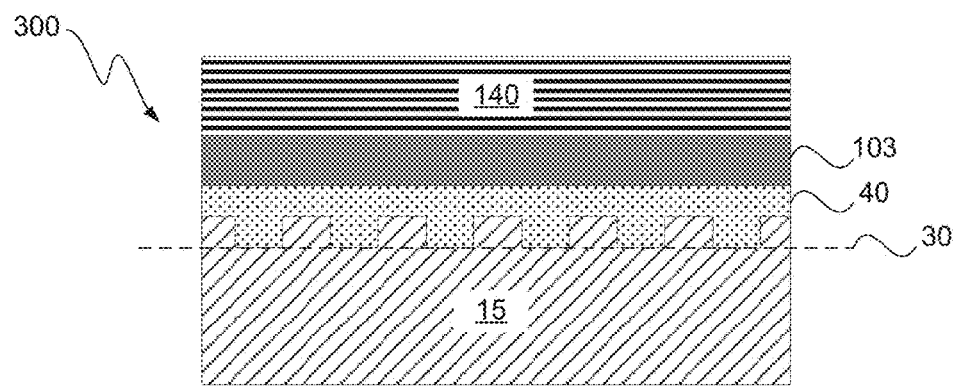
FIG. 6 depicts a third example of an RM/handler structure including an etched handler substrate, a thermal coefficient of expansion (TCE) mismatch material layer, an insulating layer, and an RM stack, in accordance with an exemplary embodiment of the present invention.

FIG. 6 depicts structure 300, which includes etched handler substrate 15, layer 40, insulating layer 103, and RM stack 140, in accordance with an exemplary embodiment of the present invention.

Details regarding etched handler substrate 15, insulating layer 103, and RM stack 140 are described supra.

In various embodiments, layer 40 is composed of any material that has a different thermal expansion coefficient and/or acoustic impedance than the material that composes etched handler substrate 15 (i.e., the material that layer 40 is composed of is a thermal expansion coefficient mismatch and/or acoustic impedance mismatch to the material that etched handler substrate 15 is composed of). In exemplary embodiments when etched handler substrate 15 is composed of stressed glass, layer 40 includes one or more of the elements tungsten (W), molybdenum (Mo), tantalum (Ta), copper (Cu), nickel (Ni), cobalt (Co), and tin (Sn). In these embodiments, layer 40 is deposited onto etched handler substrate 15 using physical vapor deposition, chemical vapor deposition or electroplating.

In various embodiments (not shown) when etched handler substrate 15 is stressed glass, insulating layer 103, as shown in structure 300, is not required. In these embodiments, layer 40 does not provide a sufficient heat sink to cause the premature termination of the exothermic reaction between reactive materials included in RM stack 140. Since stressed glass alone is a sufficient insulating material for preventing premature reaction termination of RM stack 140, the necessity of insulating layer 103 in structure 300 depends at least on the composition of layer 40 (i.e., whether the thermal conductivity of the material that layer 40 is composed of is high enough so that insulating layer 103 is necessary for complete reaction of RM stack 140).

Figure 7:
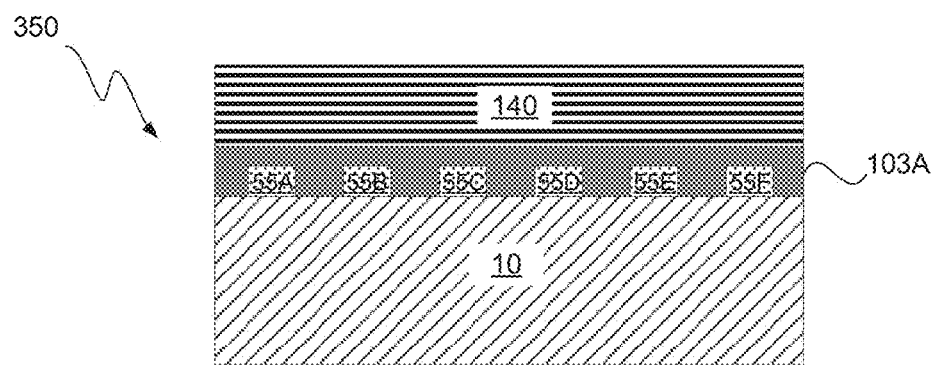
FIG. 7 depicts a fourth example of an RM/handler structure including a handler substrate, vias, insulating layer, and RM stack in accordance with an exemplary embodiment of the present invention.
Figure 8A:
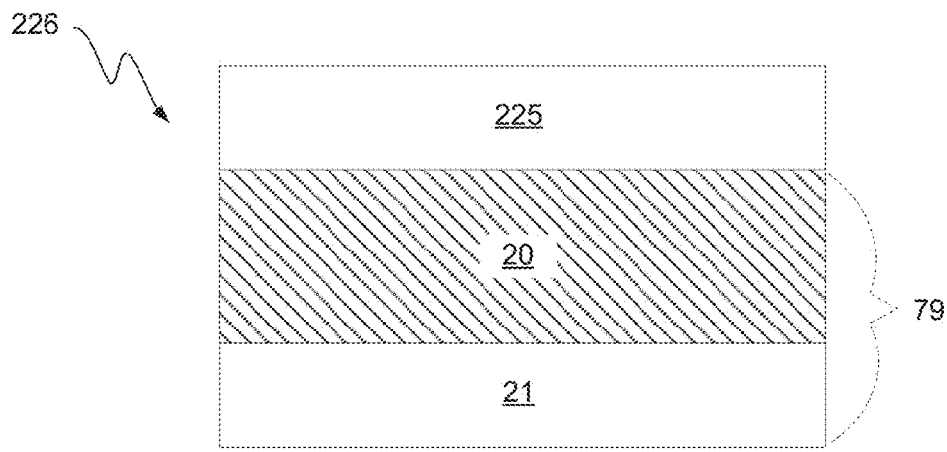
FIGS. 8A-D, 9A-D, 10A-D, 11A-D and 13A-B depict illustrative embodiments of structures that include integrated circuit (IC) substrates bonded to handler substrates that include an RM stack in accordance with exemplary embodiments of the present invention.
Figure 8B:
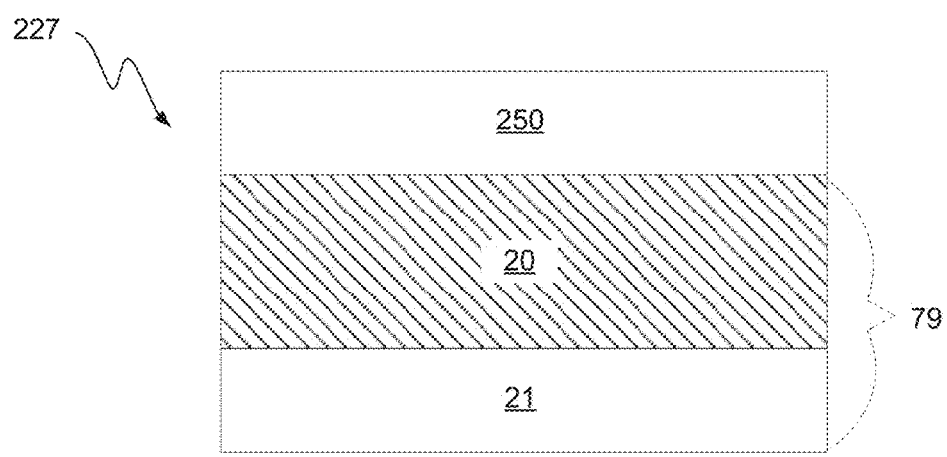
Figure 8C:
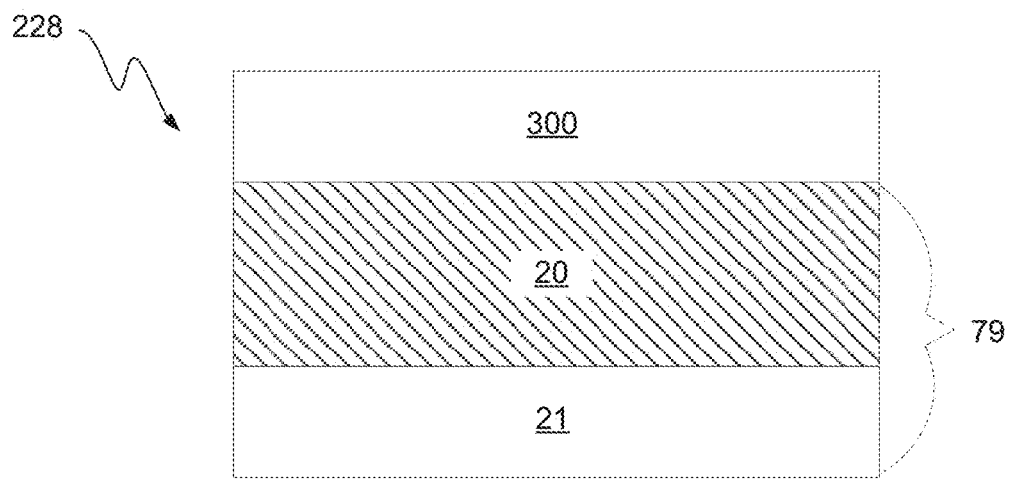
Figure 8D:
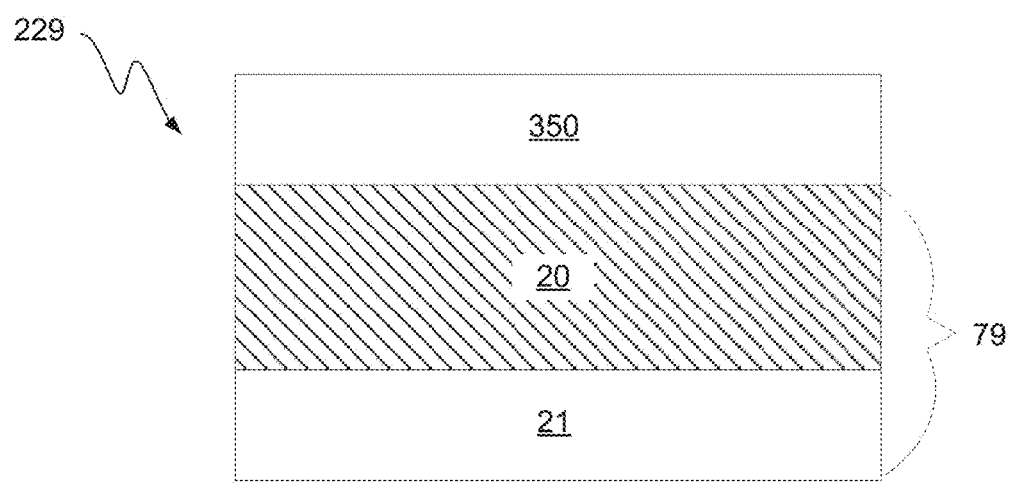

FIG. 7 depicts structure 350, which includes handler substrate 10, vias 55A-F, insulating layer 103A, and RM stack 140, in accordance with an exemplary embodiment of the present invention.

Details regarding handler substrate 10 and RM stack 140 are described supra.

In various embodiments, vias 55A-F are composed of any material that has a different thermal expansion coefficient and/or acoustic impedance than the material that composes handler substrate 10 (i.e., they are a thermal expansion coefficient mismatch and/or acoustic impedance mismatch to handler substrate 10). In exemplary embodiments when handler substrate 10 is composed of stressed glass, vias 55A-F include one or more of the elements tungsten (W), molybdenum (Mo), tantalum (Ta), copper (Cu), nickel (Ni), cobalt (Co), and tin (Sn). In these embodiments, vias 55A-F are the result of material deposition onto handler substrate 10 utilizing physical vapor deposition, chemical vapor deposition or electroplating followed by RIE patterning after lithographic patterning.

In various embodiments, insulating layer 103A is deposited on top of vias 55A-F via CVD. In various embodiments, insulating layer 103A is approximately 200 nm to approximately 1 μm thick. In other embodiments, insulating layer 103A is less than 200 nm or greater than 1 μm thick providing that it effectively serves the role of i) preventing premature termination of an exothermic reaction between reactive materials included in RM stack 140 layered above insulating layer 103A and ii) allows enough thermal energy to escape said reaction to trigger the fragmentation of a handler substrate 10. In various embodiments, insulating layer 103A is silicon dioxide ($SiO_2$), silicon nitride ($Si_3N_4$), a low-K dielectric material, and/or a poor thermal conducting polymer.

FIGS. 8A-D, 9A-D, 10A-D, 11A-D and 13A-B depict illustrative embodiments of structures that include integrated circuit (IC) substrates bonded to handler substrates that include RM stack 140 in accordance with exemplary embodiments of the present invention.

FIGS. 8A, 8B, 8C, and 8D depict structures 226, 227, 228, and 229, respectively. Structures 226, 227, 228, and 229 include structures 225, 250, 300, and 350, respectively. Structures 225, 250, 300, and 350 are described in FIGS. 4, 5, 6, and 7, respectively.

In various embodiments, structures 226, 227, 228, and 229 are integrated circuit assemblies that are fragmented when RM stack 140 (included in structures 225, 250, 300, and 350) is ignited.

To form structures 226, 227, 228, and 229, structures 225, 250, 300, and 350, respectively, are bonded to integrated circuit (IC) 79 using bonding processes described supra. IC 79 includes IC substrate 20 and IC components 21.

The composition of IC substrate 20 includes one or more of: silicon, germanium, sapphire, and III-V semiconductor material.

In various embodiments, IC substrate 20 is thinned on the side opposite IC components 21 and prior to bonding to structures 225, 250, 300, and 350. In an embodiment, the thinning process is carried out by: i) coarse grinding (approximately 5 μm/s), ii) fine grinding (less than 1 μm/s), and iii) CMP, atmospheric downstream plasma dry chemical etching (ADP DCE) and/or wet etching ($HF:HNO_3$). In various embodiments, IC substrate 20 is thinned as described above after fabrication of IC components 21.

In various embodiments, IC components 21 are the functionality and components of IC 79 (i.e., the functionality and components created during front-end-of-the-line (FEOL), memory level, back-end-of-the-line (BEOL), and far-back-end-of-the-line (FBEOL) fabrication processes). IC 79 includes transistors, memory cells, interconnects, circuits, etc.

In various embodiments, the handler substrate sides of structures 225, 250, 300, and 350 are bonded to thinned IC substrate 20 opposite IC components 21 in order to form structures 226, 227, 228, and 229, respectively.

FIGS. 9A, 9B, 9C, and 9D depict structures 236, 237, 238, and 239, respectively. Structures 236, 237, 238, and 239 include structures 225, 250, 300, and 350, respectively. Structures 225, 250, 300, and 350 are described in FIGS. 4, 5, 6, and 7, respectively.

In various embodiments, structures 236, 237, 238, and 239 are integrated circuit assemblies that are fragmented when RM stack 140 (included in structures 225, 250, 300, and 350) is ignited.

To form structures 236, 237, 238, and 239, structures 225, 250, 300, and 350, respectively, are bonded to integrated circuit (IC) 81 using bonding processes described supra. IC 81 includes IC substrate 25, vias 51A-F, and IC components 21.

In various embodiments, the composition of IC substrate 25 includes one or more of: silicon, germanium, sapphire, and III-V semiconductor material. In various embodiments, IC substrate 25 is thinned after the fabrication of IC components 21 as described for IC substrate 20. IC substrate is subsequently etched using RIE.

In various embodiments, vias 51A-F provide a mismatch in the acoustic impedance (i.e. the density of a material multiplied by the speed of sound in the material), which causes a different sound wave pattern in IC substrate 25 after fragmentation of handler substrate 10 (included in structures 225 and 350) and etched handler substrate 15 (included in structures 250 and 300). The result is that the fragmentation of IC substrate 25 is modified by the presence of vias 51A-F as compared to their absence.

In exemplary embodiments, vias 51A-F include one or more of the elements tungsten (W), molybdenum (Mo), tantalum (Ta), copper (Cu), nickel (Ni), cobalt (Co), and tin (Sn). In these embodiments, vias 51A-F are the result of material deposition onto IC substrate 25 utilizing physical vapor deposition, chemical vapor deposition or electroplating followed by CMP in order to planarize the deposited material.

After vias 51A-F are formed, the handler substrate sides of structures 225, 250, 300, and 350 are bonded to IC 81 opposite IC components 21 and on the same side as vias 51A-F in order to form structures 236, 237, 238, and 239, respectively.

FIGS. 10A, 10B, 10C, and 10D depict structures 246, 247, 248, and 249, respectively. Structures 246, 247, 248, and 249 include structures 225, 250, 300, and 350, respectively. Structures 225, 250, 300, and 350 are described in FIGS. 4, 5, 6, and 7, respectively.

In various embodiments, structures 246, 247, 248, and 249 are integrated circuit assemblies that are fragmented when RM stack 140 (included in structures 225, 250, 300, and 350) is ignited.

To form structures 246, 247, 248, and 249, structures 225, 250, 300, and 350, respectively, are bonded to integrated circuit (IC) 82 using bonding processes described supra. IC 82 includes IC substrate 25, layer 41, and IC components 21.

In various embodiments, layer 41 provides a mismatch in the acoustic impedance (i.e. the density of a material multiplied by the speed of sound in the material), which causes a different sound wave pattern in IC substrate 25 after fragmentation of handler substrate 10 (included in structures 225 and 350) and etched handler substrate 15 (included in structures 250 and 300). The result is that the fragmentation of IC substrate 25 is modified by the presence of layer 41 as compared to its absence. In exemplary embodiments, layer 41 includes one or more of the elements tungsten (W), molybdenum (Mo), tantalum (Ta), copper (Cu), nickel (Ni), cobalt (Co), and tin (Sn). In these embodiments, layer 41 is deposited onto IC substrate 25 using physical vapor deposition, chemical vapor deposition or electroplating.

After layer 41 is deposited, the handler substrate sides of structures 225, 250, 300, and 350 are bonded to IC 82 opposite IC components 21 and on the same side as layer 41 in order to form structures 246, 247, 248, and 249, respectively.

FIGS. 11A, 11B, 11C, and 11D depict structures 256, 257, 258, and 259, respectively. Structures 256, 257, 258, and 259 include structures 225, 250, 300, and 350, respectively. Structures 225, 250, 300, and 350 are described in FIGS. 4, 5, 6, and 7, respectively.

In various embodiments, structures 256, 257, 258, and 259 are integrated circuit assemblies that are fragmented when RM stack 140 (included in structures 225, 250, 300, and 350) is ignited.

To form structures 256, 257, 258, and 259, structures 225, 250, 300, and 350, respectively, are bonded to integrated circuit (IC) 83 using bonding processes described supra. IC 83 includes IC substrate 20, vias 56A-F, insulating layer 104, and IC components 21.

In various embodiments, vias 56A-F provide a mismatch in the acoustic impedance (i.e. the density of a material multiplied by the speed of sound in the material), which causes a different sound wave pattern in IC substrate 20 after fragmentation of handler substrate 10 (included in structures 225 and 350) and etched handler substrate 15 (included in structures 250 and 300). The result is that the fragmentation of IC substrate 20 is modified by the presence of vias 56A-F as compared to their absence. In exemplary embodiments, vias 56A-F include one or more of the elements tungsten (W), molybdenum (Mo), tantalum (Ta), copper (Cu), nickel (Ni), cobalt (Co), and tin (Sn). In these embodiments, vias 56A-F are the result of material deposition onto IC substrate 20 utilizing physical vapor deposition, chemical vapor deposition or electroplating followed by RIE patterning after lithographic patterning.

In various embodiments, insulating layer 104 is deposited on top of vias 56A-F via CVD. In various embodiments, insulating layer 104 is silicon dioxide ($SiO_2$), silicon nitride ($Si_3N_4$), a low-K dielectric material, and/or a poor thermal conducting polymer.

After insulating layer 104 is deposited, the handler substrate sides of structures 225, 250, 300, and 350 are bonded to IC 83 opposite IC components 21 and on the same side as insulating layer 104 in order to form structures 256, 257, 258, and 259, respectively.

Figure 12:
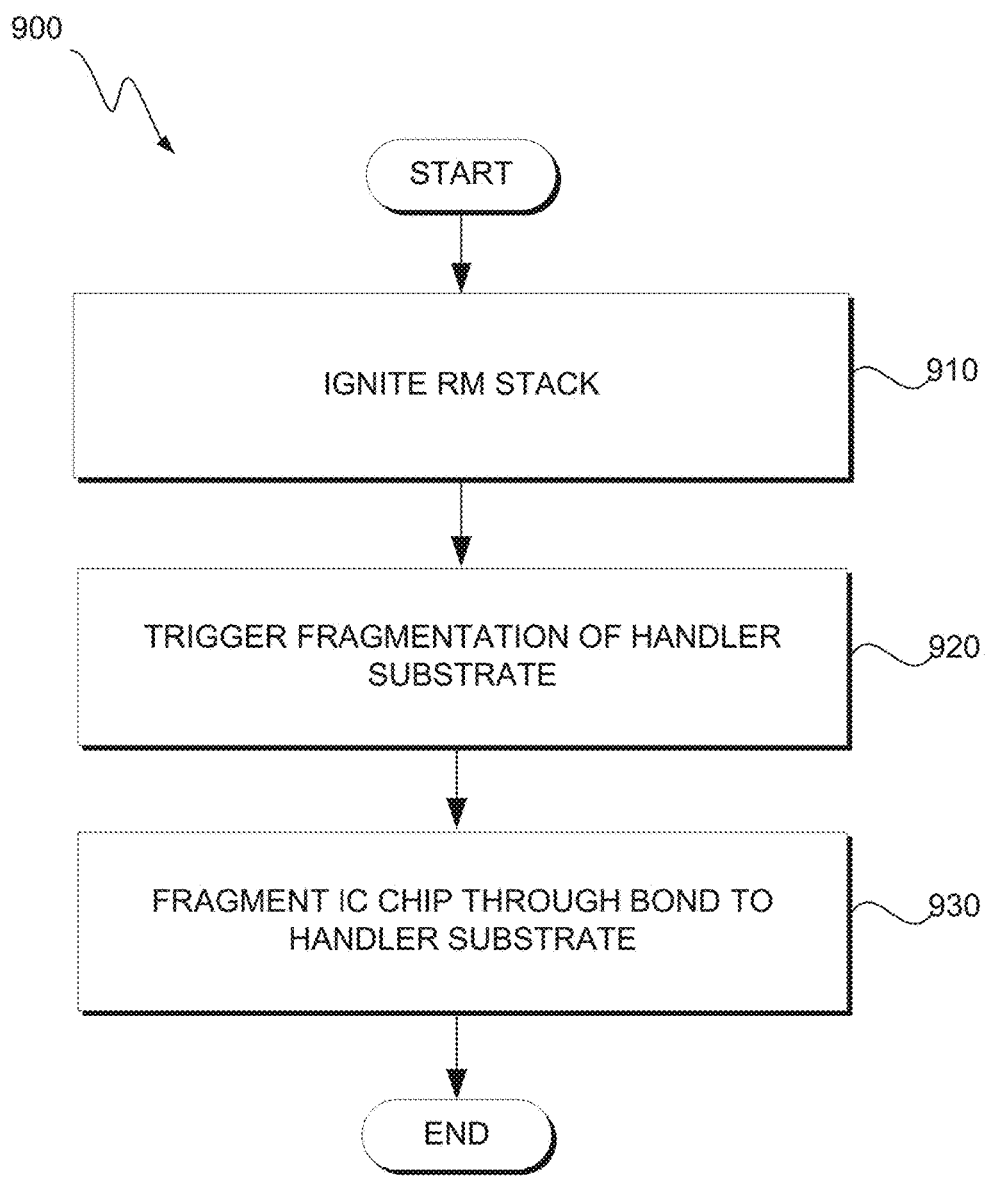
FIG. 12 illustrates a sequence of events that lead to the fragmentation of IC chips after ignition of RM stacks in accordance with exemplary embodiments of the present invention.

FIG. 12 illustrates a sequence of events that lead to the fragmentation of IC chips after ignition of RM stack 140 in accordance with exemplary embodiments of the present invention.

In step 910, RM stack 140, as depicted in embodiments described above, is ignited. In various embodiments, RM stack 140 is ignited via sources of ignition that include electrical discharge, flame, mechanical friction, impact, constant current, resistive heating, mechanical stress, a laser pulse, and/or other similar energy ignition sources. In various embodiments, ignition of RM stack 140 occurs via a command sent remotely, as a result of chip tampering, as a result of repetitive erroneous password entries, etc.

In step 920, a handler substrate such as handler substrates 10 and 15 fragment because of the energy supplied by ignition of RM stack 140. In various embodiments, fragmentation of handler substrates such as handler substrates 10 and 15 occurs because the handler substrates are a stressed brittle material such as stressed glass, which include an outer compressive domain surrounding an inner tensile domain. The ignition of RM stack 140 causes a failure of the outer compressive domain triggering a release of handler domain potential energy to provide a kinetic energy of fragmentation. In various embodiments, the failure of the outer compressive domain is facilitated by one or both of: i) thinning the compressive domain by up to 80% and ii) embedding and/or layering a material between RM stack 140 and the handler substrate stressed brittle material that has a different thermal coefficient of expansion and/or acoustic impedance compared to the handler substrate stressed brittle material.

In step 930, an IC chip such as IC 79, 81, 82, and 83 is fragmented because it is bonded to a handler substrate such as handler substrates 10 and 15 included in structures 225, 250, 300, and 350 and that handler substrate is fragmented in step 920. In various embodiments, the fragmentation of the IC chip is facilitated by the inclusion of an embedded and/or layered material between the IC chip substrate and the handler substrate as depicted and described for structures 236-239 (vias 51A-F), 246-249 (layer 41), and 256-259 (vias 56A-F). The embedded and/or layered material has a different acoustical impendence compared to the IC chip substrate (i.e., IC substrates 20 and 25).

Embodiments of the present invention are not limited by the integrated circuit assembly structures depicted in FIGS. 8A-D, 9A-D, 10A-D, 11A-D nor the RM/handler substrate structures depicted in FIGS. 4-7. Embodiments of the present invention include any structures that are capable of undergoing the sequence of events described in FIG. 12.

Figure 9A:
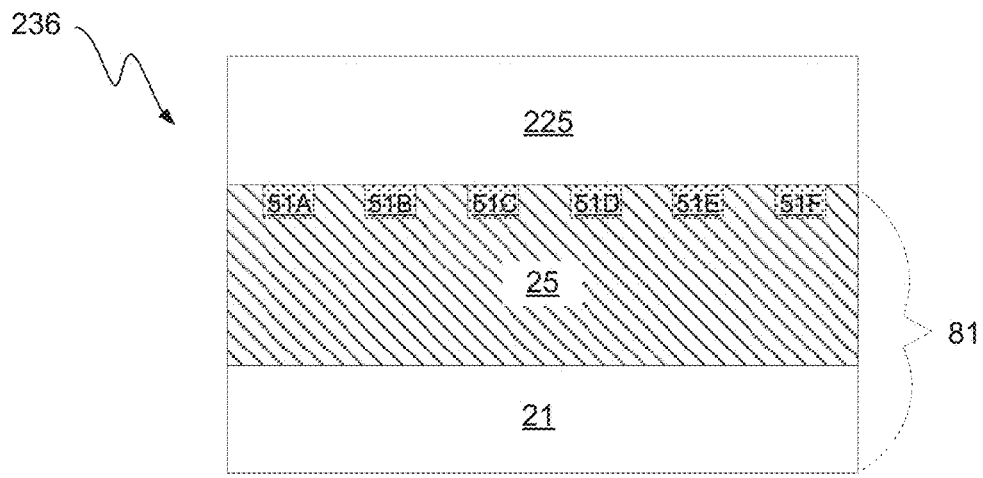
Figure 9B:
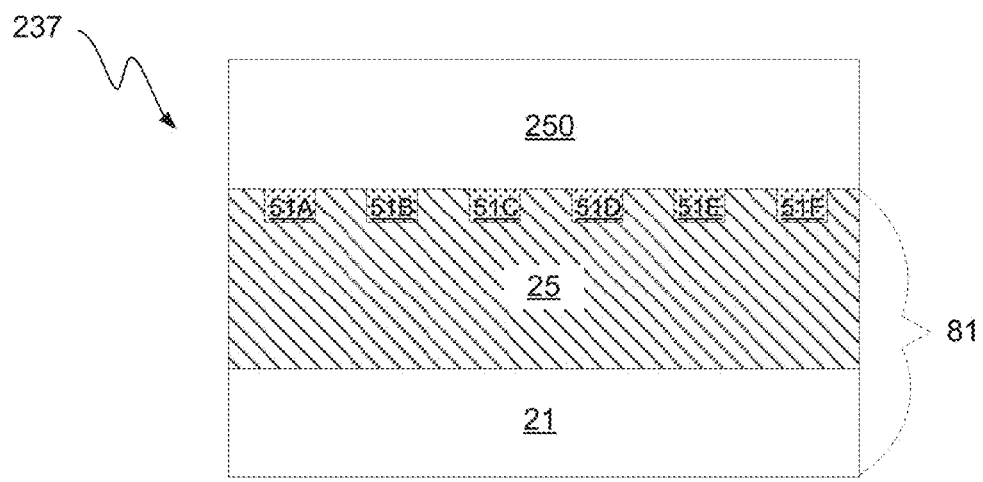
Figure 9C:
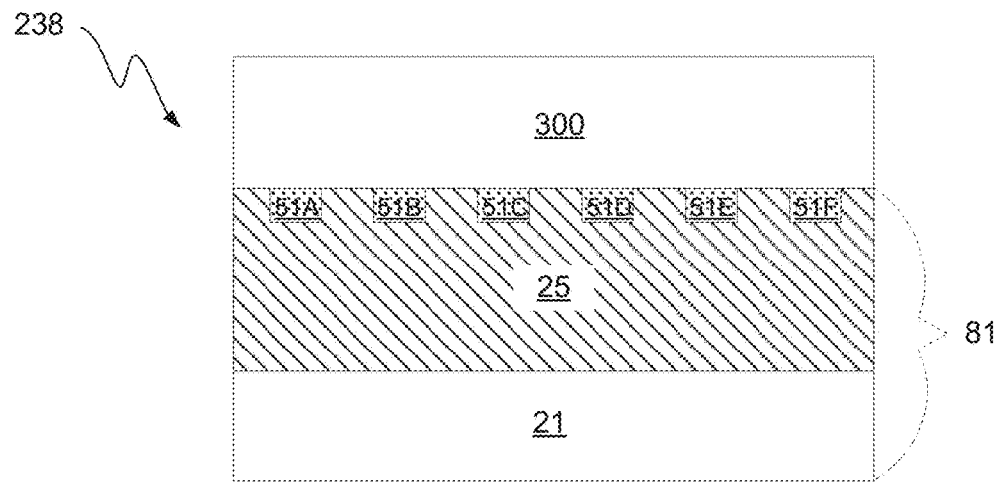
Figure 9D:
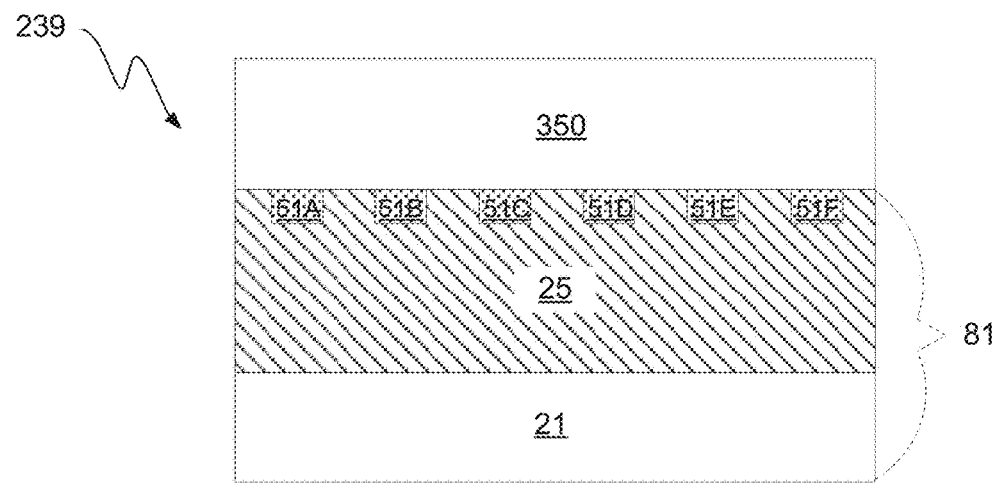
Figure 13A:
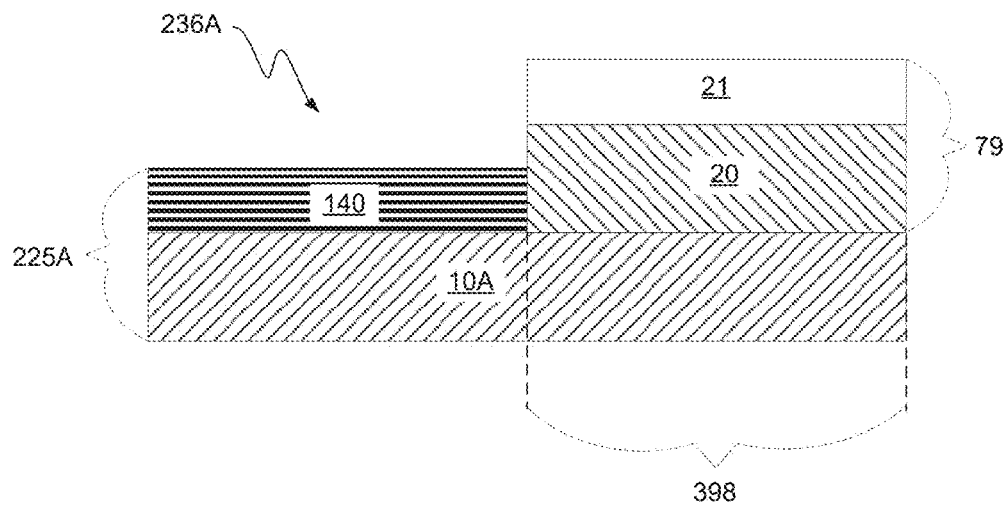

FIG. 13A depicts structure 236A, which is an alternative embodiment to structure 236 of FIG. 9A. Structure 236A includes RM stack/handler substrate structure 225A, which features extended handler substrate 10A that includes handler substrate portion 398. IC 79 is bonded to the top of handler substrate portion 398 and adjacent to RM stack 140 as depicted in FIG. 13A. Analogous to the fragmentation of structure 236 in FIG. 9A and according to the sequence of events described in FIG. 12, structure 236A undergoes fragmentation upon ignition of RM stack 140. Ignition of RM stack 140 causes the failure of the compressive domain of extended handler substrate 10A, which is analogous to the ignition of RM stack 140 causing the failure of the compressive domain of handler substrate 10 in structure 236. In both embodiments (structures 236 and 236A), failure of the compressive domain in the handler substrates is facilitated by thinning the compressive domains. Fragmentation of extended handler substrate 10A occurs as a result of its compressive domain failure analogous to the fragmentation of handler substrate 10 in structure 236 upon compressive domain failure. Fragmentation of extended handler substrate 10A causes, at least in part, the fragmentation of IC 79 just as fragmentation of handler substrate 10 in structure 236 causes, at least in part, the fragmentation of IC 79.

Figure 10A:
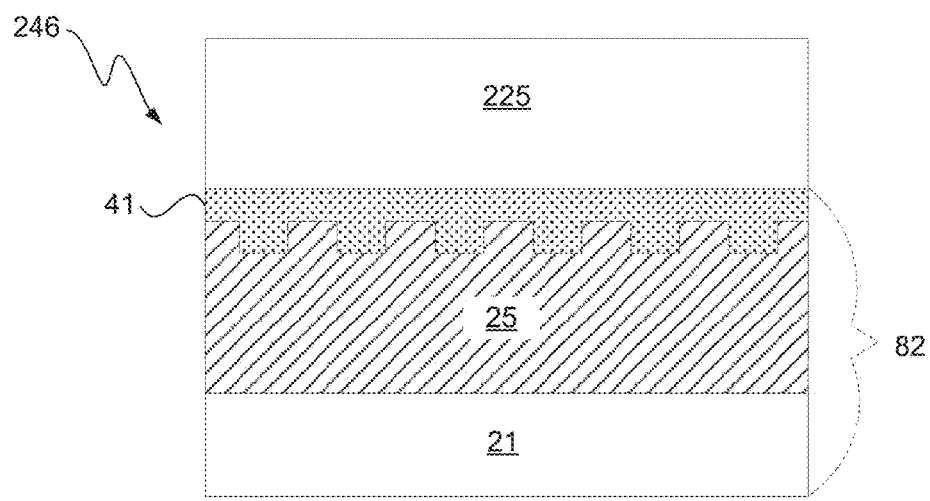
Figure 10B:
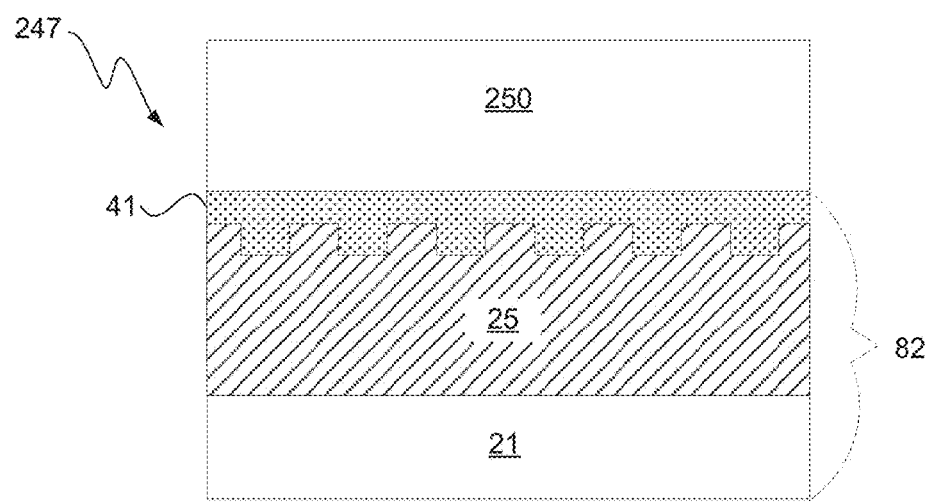
Figure 10C:
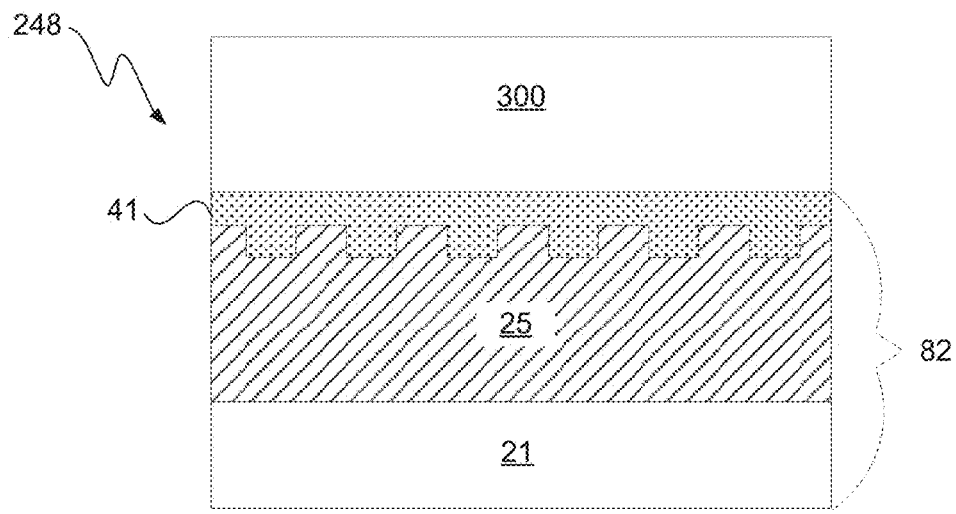
Figure 10D:
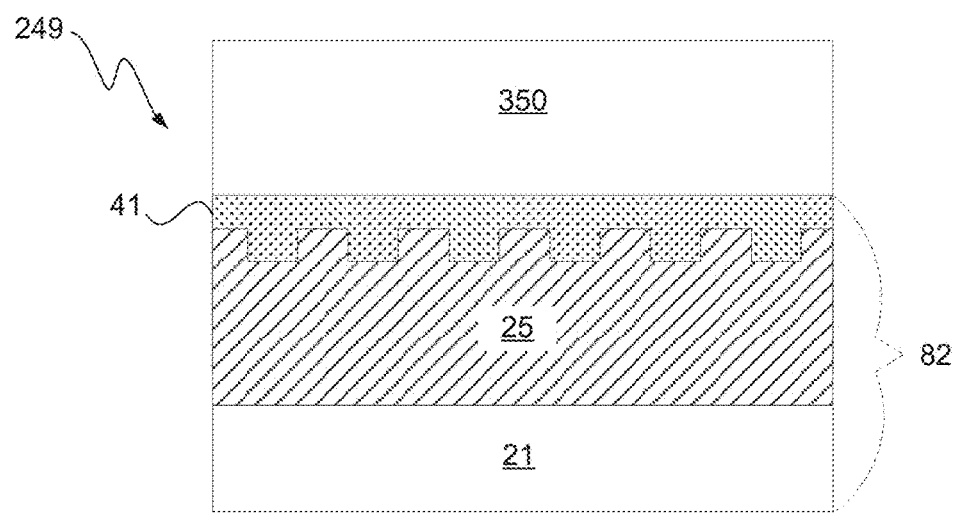
Figure 11A:
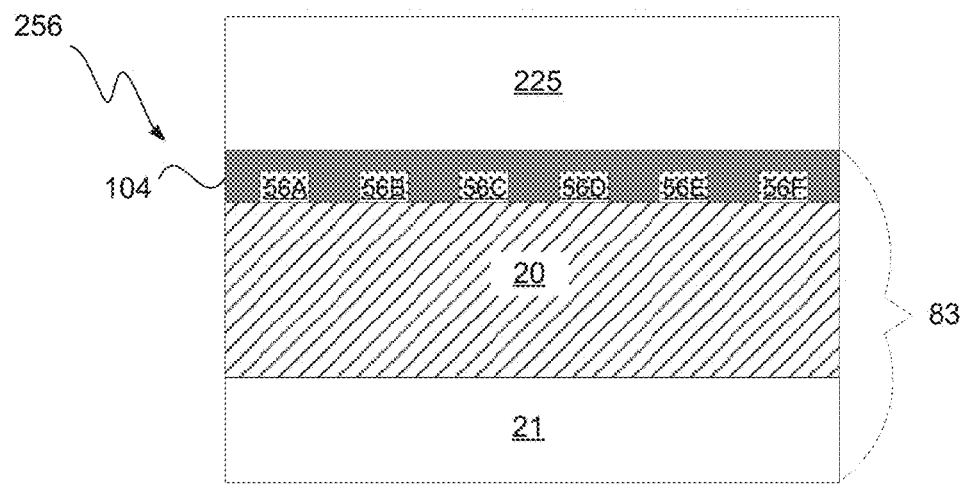
Figure 11B:
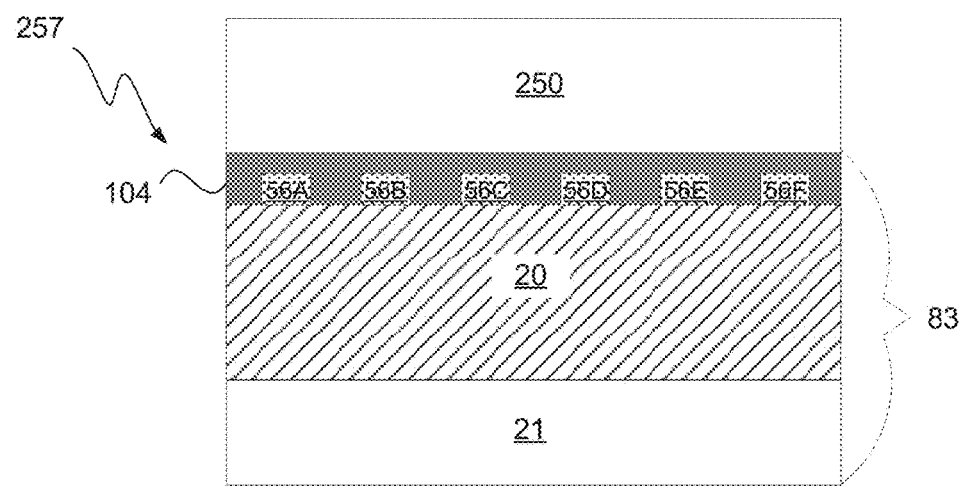
Figure 11C:
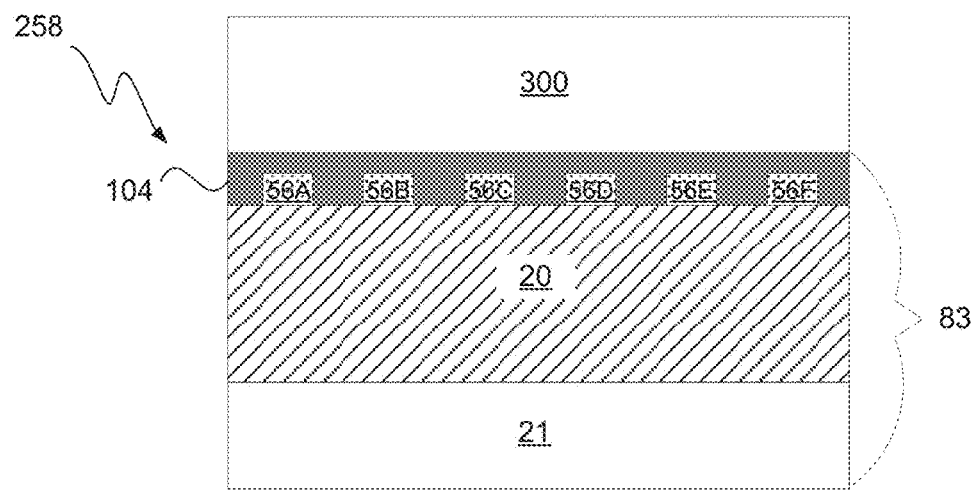
Figure 11D:
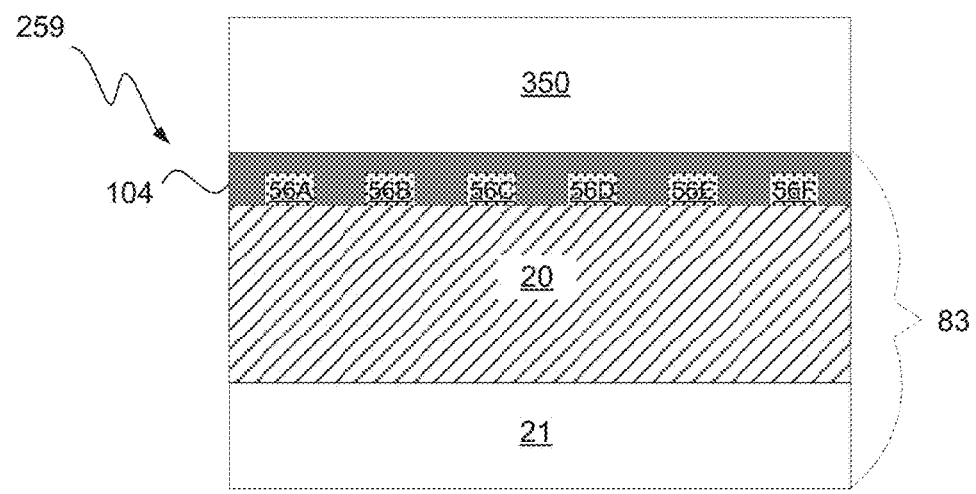
Figure 13B:
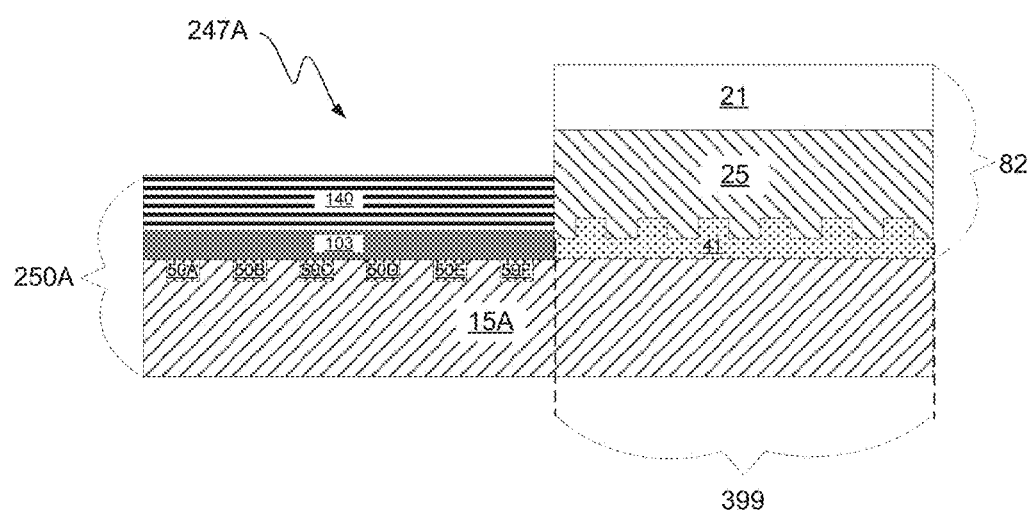

FIG. 13B depicts structure 247A, which is an alternative embodiment to structure 247 of FIG. 10B. Structure 247A includes RM stack/handler substrate structure 250A, which features extended handler substrate 15A that includes handler substrate portion 399. IC 82 is bonded to the top of handler substrate portion 399 and adjacent to insulating layer 103 and RM stack 140 as depicted in FIG. 13B. Analogous to the fragmentation of structure 247 in FIG. 10B and according to the sequence of events described in FIG. 12, structure 247A undergoes fragmentation upon ignition of RM stack 140. Ignition of RM stack 140 causes the failure of the compressive domain of extended handler substrate 15A, which is analogous to the ignition of RM stack 140 causing the failure of the compressive domain of handler substrate 15 in structure 247. In both embodiments (structures 247 and 247A), failure of the compressive domain in the handler substrates is facilitated by i) thinning the compressive domains and ii) the presence of vias 50A-F between RM stack 140 and handler substrate 15 (in structure 247) and handler substrate 15A (in structure 247A). Fragmentation of handler substrate 15A occurs as a result of its compressive domain failure analogous to the fragmentation of handler substrate 15 in structure 247 upon compressive domain failure. Fragmentation of handler substrate 15A causes, at least in part, the fragmentation of IC 82 just as fragmentation of handler substrate 15 in structure 247 causes, at least in part, the fragmentation of IC 82. In various embodiments, layer 41 provides a mismatch in the acoustic impedance (i.e. the density of a material multiplied by the speed of sound in the material), which causes a different sound wave pattern in IC substrate 25 after fragmentation of handler substrate 15A. The result is that the fragmentation of IC substrate 25 is modified by the presence of layer 41 as compared to its absence.

In various embodiments (not shown) when extended handler substrate 15A is stressed glass, insulating layer 103, as shown in structure 247A, is not required. In these embodiments, vias 50A-F do not provide a sufficient heat sink to cause the premature termination of the exothermic reaction between reactive materials included in RM stack 140. Since stressed glass alone is a sufficient insulating material for preventing premature reaction termination of RM stack 140, the necessity of insulating layer 103 in structure 247A depends at least on: i) the composition of vias 50A-F (i.e., whether the thermal conductivity of the material that vias 50A-F are composed of is high enough so that insulating layer 103 is necessary for complete reaction of RM stack 140) and ii) the amount of surface area on RM stack 140 that vias 50A-F would be in contact with absent insulating layer 103.

It should be understood that other structural variants analogous to structures 236A and 247A can be envisioned based on the structures presented in FIGS. 8A-D, 9A-D, 10A-D, 11A-D accompanied by the processes described in FIG. 12. Further, embodiments of the present invention are not limited by the structures depicted in FIGS. 8A-D, 9A-D, 10A-D, 11A-D and 13A-B. The structures depicted in FIGS. 8A-D, 9A-D, 10A-D, 11A-D and 13A-B have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein.

In addition, any specified material or any specified dimension of any structure described herein is by way of example only. Furthermore, as will be understood by those skilled in the art, the structures described herein may be made or used in the same way regardless of their position and orientation. Accordingly, it is to be understood that terms and phrases such as, for instance, "side", "over", "perpendicular", "tilted", etc., as used herein refer to relative location and orientation of various portions of the structures with respect to one another, and are not intended to suggest that any particular absolute orientation with respect to external objects is necessary or required.

The foregoing specification also describes processing steps. While some of the steps may be in an ordered sequence, others may in different embodiments from the order that they were detailed in the foregoing specification. The ordering of steps when it occurs is explicitly expressed, for instance, by such adjectives as, "ordered", "before", "after", "following", and others with similar meaning.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature, or element, of any or all the claims.

Many modifications and variations of the present invention are possible in light of the above teachings, and could be apparent for those skilled in the art.

In some embodiments, the present invention is embodied as an integrated circuit chip that is configured for fragmentation.

Embodiments of the present invention may be used in a variety of electronic applications, including but not limited to advanced sensors, memory/data storage, semiconductors, microprocessors and other applications.

The resulting integrated circuit chips that incorporate RM stacks and handler substrates can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Having described the preferred embodiment of creating devices/structures capable of undergoing fragmentation (which are intended to be illustrative and not limiting), it is noted that modifications and variations may be made by persons skilled in the art in light of the above teachings.

What is claimed is:

1. An integrated circuit (IC) assembly comprising:
a first substrate;
a second substrate, wherein the second substrate is bonded to the first substrate;
one or more IC components, wherein the one or more IC components are formed on the second substrate on a side opposite to a bond between the first substrate and the second substrate;
a layer of one or more pairs of reactive materials, wherein the layer of one or more pairs of reactive materials are formed on the first substrate on a side opposite to the bond between the first substrate and the second substrate; and a plurality of vias composed of a first material, wherein the first material includes a different acoustic impedance than a second material included in the second substrate, wherein the second material included in the second substrate is in direct contact with the first material in the plurality of vias.

2. The IC assembly of claim 1, further comprising:
the plurality of vias composed of the first material, wherein the first material includes one or both of: i) a different thermal expansion coefficient than a second material included in the first substrate and ii) a different acoustic impedance than the second material included in the first substrate, wherein the second material included in the first substrate is in direct contact with the first material in the plurality of vias.

3. The IC assembly of claim 1, wherein the first substrate is stressed glass that is thinned by one or both grinding and etching in order to remove a portion of an outer compressive layer.

4. The IC assembly of claim 1, further comprising:
a plurality of vias composed of a first material, wherein the first material includes a different acoustic impedance than a second material included in the first substrate, wherein the second material included in the first substrate is in direct contact with the first material in the plurality of vias.

5. The IC assembly of claim 1, further comprising:
a barrier layer between each reactive material of the layer of the one or more pairs of reactive materials.

6. The IC assembly of claim 5, wherein the barrier layer is a multilayer stack composed of two or more materials.

7. The IC assembly of claim 5, wherein the barrier layer is a transition metal.

8. The IC assembly of claim 1, further comprising:
an insulation layer between the first substrate and the layer of the one or more pairs of reactive materials.

9. The IC assembly of claim 8, wherein the insulation layer is over the first substrate with the plurality of vias composed of the first material.

10. An integrated circuit (IC) assembly comprising:
a first substrate;
a second substrate, wherein the second substrate is bonded to the first substrate;
one or more IC components, wherein the one or more IC components are formed on the second substrate on a side opposite to a bond between the first substrate and the second substrate;
a layer of one or more pairs of reactive materials, wherein the layer of one or more pairs of reactive materials are formed on the first substrate on a side opposite to the bond between the first substrate and the second substrate; and
one or more layers composed of a first material, wherein the first material includes a different acoustic impedance than a second material included in the second substrate, wherein the second material included in the second substrate is in direct contact with the first material in the one or more layers.

11. The IC assembly of claim 10, wherein the first material includes one or both of: i) a different thermal expansion coefficient than a second material included in the first substrate and ii) a different acoustic impedance than the second material included in the first substrate, wherein the second material included in the first substrate is in direct contact with the first material in the one or more layers.

12. The IC assembly of claim 10, further comprising:
a plurality of vias composed of a first material, wherein the first material includes a different acoustic impedance than a second material included in the first substrate, wherein the second material included in the first substrate is in direct contact with the first material in the plurality of vias.

13. The IC assembly of claim 10, wherein the first substrate is stressed glass that is thinned by one or both grinding and etching in order to remove a portion of an outer compressive layer.

14. The IC assembly of claim 10, further comprising:
a barrier layer between each reactive material of the layer of the one or more pairs of reactive materials.

15. The IC assembly of claim 14, wherein the barrier layer is a multilayer stack composed of two or more materials.

16. The IC assembly of claim 14, wherein the barrier layer is a transition metal.

17. The IC assembly of claim 10, further comprising:
an insulation layer is between the one or more layers composed of the first material and the layer of the one or more pairs of reactive materials.

* * * * *